United States Patent [19]
Yokoyama

[11] Patent Number: 5,586,138
[45] Date of Patent: Dec. 17, 1996

[54] MULTIPLE-CAVITY SEMICONDUCTOR LASER CAPABLE OF GENERATING ULTRASHORT LIGHT PULSE TRAIN WITH ULTRAHIGH REPETITION RATE

[75] Inventor: Hiroyuki Yokoyama, Tokyo, Japan

[73] Assignee: NEC Corporation, Japan

[21] Appl. No.: 418,001

[22] Filed: Apr. 6, 1995

[30] Foreign Application Priority Data

Apr. 26, 1994 [JP] Japan ................... 6-088578

[51] Int. Cl.⁶ .............. H01S 3/082; H01S 3/10; H01S 3/19
[52] U.S. Cl. .............. 372/97; 372/18; 372/25; 372/26; 372/28; 372/50; 372/96
[58] Field of Search .............. 372/97, 96, 19, 372/25, 26, 28, 22, 18, 32

[56] References Cited

U.S. PATENT DOCUMENTS 5,455,836  10/1995  Li et al. ................... 372/25

OTHER PUBLICATIONS

"Monolithic Colliding–Pulse Mode–Locked Quantum–Well Lasers" by Young–Kai Chen and Ming C. Wu; IEEE Journal of Quantum Electronics, vol. 28, No. 10; Oct. 1992.

Primary Examiner—James W. Davie
Attorney, Agent, or Firm—Hayes, Soloway, Hennessey, Grossman & Hage, P.C.

[57] ABSTRACT

A semiconductor laser is provided which is capable of generating a train of ultrashort light pulses with an ultrahigh repetition frequency and which is useful in optical communications and optical information processing. The semiconductor laser is a mode-locked semiconductor laser which has two resonator cavities which are formed by two facets and a distributed feedback structure between these two facets. The length of the resonator cavity formed between one facet and the distributed feedback structure is 1/m (where m is an integer) of the length of the resonator cavity formed by the other facet and the distributed feedback structure. A saturable absorption region and a high-frequency modulation region are provided within the longer of the resonator cavities. By making the high-frequency modulation frequency be equal to the round trip frequency of the light within the longer resonator cavity, mode-locked operation is achieved. Because of the linking of the shorter resonator cavity, a train of light pulses having a repetition frequency of m times the mode-locked pulse train frequency is obtained.

5 Claims, 2 Drawing Sheets

MULTIPLE-CAVITY SEMICONDUCTOR LASER CAPABLE OF GENERATING ULTRASHORT LIGHT PULSE TRAIN WITH ULTRAHIGH REPETITION RATE

BACKGROUND OF THE INVENTION (1) Field of the Invention

The present invention relates to a semiconductor laser capable of generating an ultrashort light pulse train with an ultrahigh repetition rate, which is usable in optical communications and optical information processing.

(2) Description of the Related Art

In recent years, there has been an increasing demand in the fields of optical communications and optical information processing for basic technologies to enable the generation of pulse trains having ultrahigh repetition rates which range from several tens of gigahertz to more than 100 gigahertz. One type of light oscillator which generates high-speed light pulses is a mode-locked semiconductor laser having a two- or three-section configuration. It has been reported that, in this device, it has been possible to apply reverse bias to one section, which is separated by means of electrodes, resulting in operation in the saturable absorption region, thereby enabling achievement of self-excited pulse oscillations having a repetition frequency of 100 GHz and above. This technology has been described in the literature by, for example, Y. K. Chen (paper in the IEEE Journal of Quantum Electronics, Vol. 28, No. 10, pages 2176 to 2185).

SUMMARY OF THE INVENTION

In optical communications applications, to achieve light pulse repetition frequency accuracy and stable operation, it is necessary to perform electrical control at high frequencies. In a mode-locked semiconductor laser as mentioned above, the resonator cavity is shortened, thereby shortening the time required for circulation (round trip) of the light pulse within the cavity and increasing the repetition frequency, that is, increasing the fundamental mode-locking frequency, and this requires a high-frequency input of several gigahertz for the purpose of control by means of electrical modulation. However, the use of such an ultra-high frequency signal requires extremely specialized equipment and components, resulting in the problems of high cost and difficult operation.

An object of the present invention is to provide an ultrahigh-speed light oscillator which is amenable to easy electrical control of its frequency, and which eliminates the problems, described above, which are associated with ultra-high-speed light oscillators in the prior art.

To achieve the above-noted object, a semiconductor laser according to the present invention has two resonator cavities of differing lengths in one and the same element, one of these resonator cavities having a length that is 1/m (where m is an integer) of the length of the other resonator cavity, and the reflecting mirrors common to the two resonator cavities being of the distributed feedback type. The region for high-frequency modulation is located in the longer of the resonator cavities. In addition, the saturable absorption region is also located in the longer of the resonator cavities. The method of operation of this semiconductor laser is to perform high-frequency modulation at the fundamental mode-locking frequency in the longer of the resonator cavities.

The present invention achieves a high mode-locking frequency by making use of the effect of a compound resonator cavity. Specifically, if operating conditions are established under which one light pulse makes a round trip within the longer of the resonator cavities, in a 1/m resonator cavity (where m is an integer) resonator cavity which is linked by a common reflection mirror in a distributed feedback configuration, the repetition frequency of the light pulse will be multiplied by the integer m. In the steady-state condition, the light pulse makes a round trip within the compound resonator cavity at that repetition frequency. To achieve mode-locked operation in which a single ultrashort light pulse makes a round trip within the longer of the resonator cavities, the saturable absorption region can be provided within the longer of the resonator cavities. Modulation of the gain or loss at that light pulse frequency is effective in achieving stabilization of this operation. As a result, a light pulse is obtained which has a repetition frequency that is an integral multiple of the modulation frequency. FIGS. 2A–2C illustrate this in the time domain.

FIG. 2A shows a sine-wave 101 used for the purpose of modulation, with the modulation frequency being established by the modulation period (T) 201. FIG. 2B shows the mode-locked pulse train 102 which is generated from a long resonator cavity when there is no linked shorter resonator cavity, the fundamental mode-locked period 202 being equal to the modulation period 201. FIG. 2C shows the harmonic mode-locked pulse train 103 which is generated when a resonator cavity having a length of 1/m (where m is an integer) is linked to the long resonator cavity, the period 203 of this pulse train being 1/m of the modulation period 201. That is, its repetition frequency is m times the modulation frequency.

BRIEF DESCRIPTION OF THE DRAWINGS

The above and other objects, features and advantages of the present invention will be apparent from the following description of a preferred embodiment of the invention explained with reference to the accompanying drawings, in which.

PREFERRED EMBODIMENTS OF THE INVENTION

Figure 1:
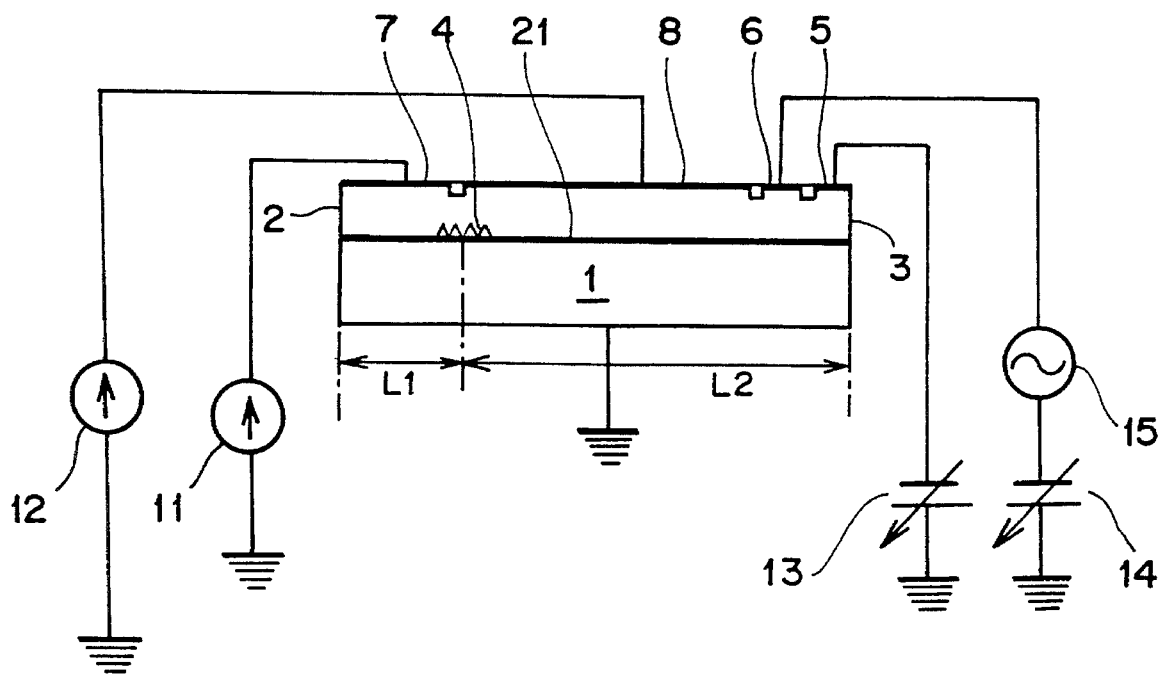
FIG. 1 is a drawing which provides a schematic representation of the embodiment of a semiconductor laser according to the present invention.
Figure 2A:
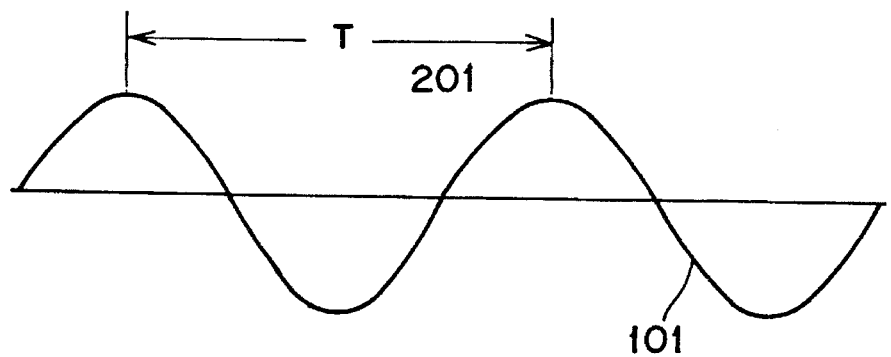
FIGS. 2A–2C are drawings which show the time-domain relationships of modulation frequency and the generated light pulses for mode-locked operation of a semiconductor laser according to the present invention.
Figure 2B:
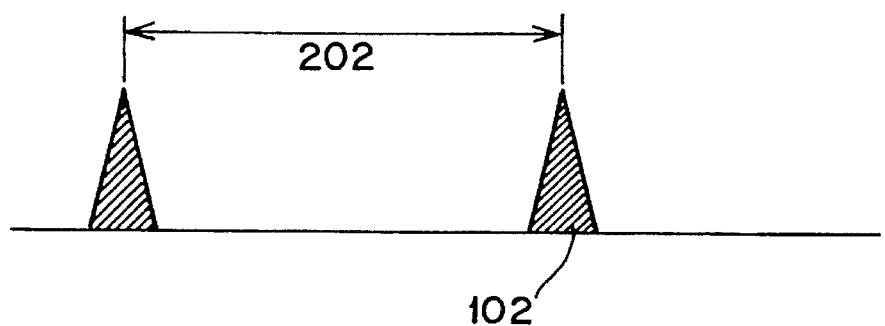
Figure 2C:
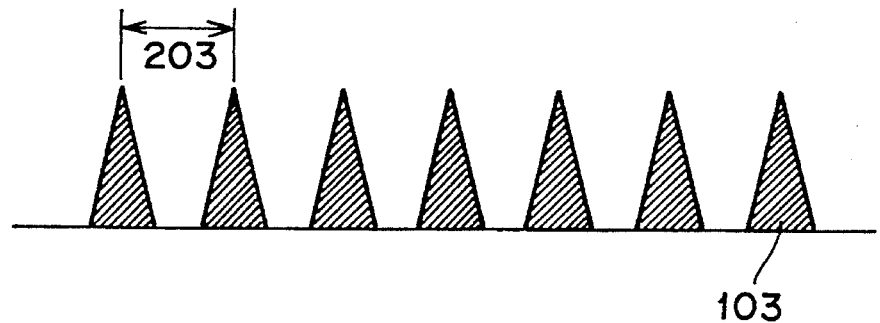

A preferred embodiment of the invention is now explained with reference to the appendix drawings. FIG. 1 is a schematic representation of the construction of a semiconductor laser according to the present invention. Semiconductor laser 1 is a compound-cavity laser which has an active layer 21 and two resonator cavities, which are formed by means of a facet 2, a facet 3, and a distributed feedback structure 4 provided between these facets. The length L1 of the shorter resonator cavity formed by the facet 2 and the common distributed feedback structure 4 is 1/m (where m is an integer) of the length L2 of the longer resonator cavity formed by the facet 3 and the common distributed feedback structure 4. A saturable absorption region 5 and a resonator loss high-frequency modulation region 6 are provided inside the longer resonator cavity formed by the facet 3 and the distributed feedback structure 4. A DC power supply 11 and a DC power supply 12 drive a forward current into a gain region 7 and a gain region 8, respectively. The saturable absorption region 5 is reverse-biased by a DC power supply 13, and the high-frequency modulation region 6 is reverse-biased by a DC power supply power D14 and is high-frequency modulated by a high-frequency generator 15. The frequency of this high-frequency modulation is set to be equal to the circulation frequency (round trip frequency) of the light inside the resonator formed by the facet 3 and the distributed feedback structure 4.

In this embodiment, the overall length of the semiconductor laser 1 was made approximately 5 mm, the center position of the distributed feedback structure 4 was positioned at approximately 1 mm from the facet 2, the width of the saturable absorption region 5 which is adjacent to the other the facet 3, was made 200 µm, and the width of the resonator loss high-frequency modulation region 6 was also made 200 µm. Also, in this embodiment, the active layer 21 of the semiconductor laser 1 was formed from InGaAs/InGaAsP with a multiple quantum-well (MQW) structure. The operation of this semiconductor laser is described below.

With the construction as shown in FIG. 1, currents of approximately 50 mA and approximately 200 mA, are injected into the gain region 7 and the gain region 8, respectively, a reverse bias of 3 volts is applied to the saturable absorption region 5, a reverse bias of 3 volts is applied to the high-frequency modulation region 6, and with a high-frequency signal at about 10 GHz applied, stable mode-locked operation with a light pulse width of approximately 2 ps and a repetition frequency of approximately 40 GHz is achieved. This light pulse repetition frequency is four times the modulation frequency, demonstrating the effective use of the operating principle of the present invention.

Furthermore, whereas the above-noted embodiment of the present invention is a semiconductor laser formed by an InGaAs/InGaAsP multiple quantum-well (MQW) structure, with two of three reflection mirrors formed at cleavage planes, the principle of the present invention clearly does not present a limitation to any specific material, and with respect to the resonator cavities as well, it is also possible to make use of a distributed feedback structure for all the reflection mirrors.

By virtue of the method of operation described above for a semiconductor laser according to the present invention, it is possible, by means of high-frequency control in a region up to approximately 10 GHz, to achieve a light pulse of an ultrahigh repetition frequency of several tens of gigahertz, which will be important in future ultrahigh-speed optical communications applications, and it is possible to do so without the addition of special equipment.

While the invention has been described in its preferred embodiment, it is to be understood that the words which have been used are words of description rather than limitation and that changes within the purview of the appended claims may be made without departing from the true scope of the invention as defined by the claims.

What is claimed is:

1. A semiconductor laser comprising:

a resonator having two resonator cavities, which have different lengths, all in a unitary structure, one of said resonator cavities having a length 1/m (where m is an integer) that of the other of said two resonator cavities; and a reflection mirror which is common to said two resonator cavities and which has a distributed feedback construction.

2. A semiconductor laser according to claim 1, further comprising a high-frequency modulation region which is disposed within a longer one of said two resonator cavities, for performing high-frequency modulation with a fundamental mode-locking frequency.

3. A semiconductor laser according to claim 2, further comprising a high frequency generator which is coupled to said high-frequency modulation region.

4. A semiconductor laser according to claim 1, further comprising a saturable absorption region which is disposed within a longer one of said two resonator cavities.

5. A semiconductor laser according to claim 4, wherein said saturable absorption region is reverse-biased by a DC power supply.

* * * * *